(12) United States Patent
Sorich et al.

(10) Patent No.: US 7,166,860 B2
(45) Date of Patent: *Jan. 23, 2007

(54) ELECTRONIC DEVICE AND PROCESS FOR FORMING SAME

(75) Inventors: Stephen Sorich, Goleta, CA (US); Matthew Stainer, Goleta, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 17 days.

This patent is subject to a terminal disclaimer.

(21) Appl. No.: 11/134,100

(22) Filed: May 20, 2005

(65) Prior Publication Data

US 2006/0145143 A1  Jul. 6, 2006

Related U.S. Application Data

(60) Provisional application No. 60/640,502, filed on Dec. 30, 2004.

(51) Int. Cl.
*H01L 29/08* (2006.01)
*H01L 21/00* (2006.01)

(52) U.S. Cl. .................. 257/40; 257/642; 257/E51.02; 438/82; 438/99

(58) Field of Classification Search .................. 257/40, 257/642, E51.02; 438/99, 82
See application file for complete search history.

(56) References Cited

U.S. PATENT DOCUMENTS

| | | |
|---|---|---|
| 4,705,592 A | 11/1987 | Bahrle |
| 4,735,676 A | 4/1988 | Iwasa |
| 4,784,721 A | 11/1988 | Holmen et al. |
| 4,914,742 A | 4/1990 | Higashi et al. |
| 5,133,036 A | 7/1992 | Tornqvist |
| 5,158,645 A | 10/1992 | Covert et al. |
| 5,244,817 A | 9/1993 | Hawkins et al. |
| 5,284,548 A | 2/1994 | Carey et al. |
| 5,364,742 A | 11/1994 | Fan et al. |
| 5,441,139 A | 8/1995 | Abe et al. |
| 5,532,174 A | 7/1996 | Corrigan |
| 5,559,345 A | 9/1996 | Kim |
| 5,589,732 A | 12/1996 | Okibayashi et al. |

(Continued)

FOREIGN PATENT DOCUMENTS

EP   0 445 881 A1   9/1991

(Continued)

OTHER PUBLICATIONS

U.S. Appl. No. 10/910,496, filed Aug. 3, 2004, MacPherson et al.

(Continued)

*Primary Examiner*—Long Tran
(74) *Attorney, Agent, or Firm*—John H. Lamming

(57) ABSTRACT

An electronic device includes a substrate and a well structure overlying the substrate and defining an array of openings. From a cross-sectional view, the well structure, at the openings has a negative slope. From a plan view, each opening corresponds to an organic electronic component. Each opening within the array of openings has a width and two immediately adjacent openings within the array of openings are connected by a channel having a width smaller than the width of each opening.

18 Claims, 8 Drawing Sheets

U.S. PATENT DOCUMENTS

| | | | |
|---|---|---|---|
| 5,616,514 A | 4/1997 | Muchow et al. | |
| 5,701,055 A | 12/1997 | Nagayama et al. | |
| 5,714,840 A | 2/1998 | Tanabe et al. | |
| 6,075,319 A | 6/2000 | Kanda et al. | |
| 6,160,345 A | 12/2000 | Tanaka et al. | |
| 6,169,357 B1 | 1/2001 | Potter | |
| 6,242,859 B1 | 6/2001 | Betsui et al. | |
| 6,309,501 B1 | 10/2001 | Kelley | |
| 6,383,327 B1 | 5/2002 | Mase | |
| 6,465,286 B1 | 10/2002 | Possin et al. | |
| 6,476,988 B1 | 11/2002 | Yudasaka | |
| 6,547,973 B1 | 4/2003 | Field | |
| 6,596,443 B1 | 7/2003 | Weaver et al. | |
| 6,948,993 B1 * | 9/2005 | Yi et al. | 445/24 |
| 6,992,326 B1 * | 1/2006 | MacPherson et al. | 257/40 |
| 2002/0036466 A1 | 3/2002 | Tanaka et al. | |
| 2002/0060518 A1 | 5/2002 | Duineveld et al. | |
| 2002/0081847 A1 | 6/2002 | Jo et al. | |
| 2002/0109456 A1 | 8/2002 | Morii et al. | |
| 2002/0113547 A1 | 8/2002 | Ishikawa et al. | |
| 2002/0127844 A1 | 9/2002 | Grill et al. | |
| 2002/0163300 A1 | 11/2002 | Duineveld et al. | |
| 2003/0010745 A1 | 1/2003 | Field | |
| 2003/0010746 A1 | 1/2003 | Gutierrez et al. | |
| 2003/0011304 A1 | 1/2003 | Duineveld et al. | |
| 2003/0068574 A1 | 4/2003 | Shiraki et al. | |
| 2003/0076608 A1 | 4/2003 | Yudasaka | |
| 2004/0101988 A1 | 5/2004 | Roman, Jr. et al. | |
| 2004/0144975 A1 * | 7/2004 | Seki et al. | 257/40 |

FOREIGN PATENT DOCUMENTS

| | | |
|---|---|---|
| JP | 6-325873 A | 11/1994 |
| JP | 2002-124381 A | 4/2002 |
| WO | WO 00/48236 A1 | 8/2000 |
| WO | WO 02/21883 A1 | 3/2002 |

OTHER PUBLICATIONS

U.S. Appl. No. 10/915,578, filed Aug. 10, 2004, Truong et al.

* cited by examiner

ELECTRONIC DEVICE AND PROCESS FOR FORMING SAME

This application claims priority to Provisional Application No. 60/640,502 filed Dec. 30, 2004.

FIELD OF THE INVENTION

This invention relates in general to electronic devices and methods for forming electronic devices. More specifically, the invention relates to electronic devices including organic electronic components

BACKGROUND INFORMATION

Increasingly, active organic molecules are used in electronic devices. These active organic molecules have electronic or electro-radiative properties including electroluminescence. Electronic devices that incorporate organic active materials may be used to convert electrical energy into radiation and may include a light-emitting diode, light-emitting diode display, or diode laser. Electronic devices that incorporate organic active layers may also be used to generate signals in response to radiation (e.g., photodetectors (e.g., photoconductive cells, photoresistors, photoswitches, phototransistors, phototubes), infrared ("IR") detectors, biosensors); convert radiation into electrical energy (e.g., a photovoltaic device or solar cell); and perform logic functions (e.g. a transistor or diode).

However, the manufacturing of electronic components that include organic active layers is difficult. Inconsistent formation of organic active layers typically leads to poor device performance and poor yield in device fabricating processes. In the case of liquid deposition of organic active layers, poor wetting of electrodes may lead to voids within the organic active layer.

When a liquid composition is deposited into a well formed by a surrounding structure, it may form voids. Such voids decrease the available surface area for radiation emission or radiation absorption, leading to reduced performance. Voids may also expose underlying structures, such as electrodes. When additional layers are formed over organic layers resulting from curing the liquid composition, these layers may contact the underlying structure, permitting electrical shorting between electrodes and rendering an affected organic electronic component inoperable.

Negatively sloped structures may be used to prevent voids. However, such structures may form breaks in overlying electrode structures, such as cathodes.

SUMMARY OF THE INVENTION

In one exemplary embodiment, an electronic device includes a substrate and a well structure overlying the substrate and defining an array of openings. From a cross-sectional view, the well structure, at the openings has a negative slope. From a plan view, each opening corresponds to an organic electronic component. Each opening within the array of openings has a width and two immediately adjacent openings within the array of openings are connected by a channel having a width less than the width of each opening.

In another exemplary embodiment, an electronic device includes a substrate and a first structure overlying the substrate and defining an array of openings. From a cross-sectional view, the first structure, at the openings, has a negative slope. From a plan view, each opening corresponds to an organic electronic component. Two immediately adjacent openings are connected by a channel. The electronic device further includes a second structure overlying the substrate and located between the two immediately adjacent openings and within the channel.

In a further exemplary embodiment, a process for forming an electronic device includes the step of forming a well structure over a substrate. The well structure defines an array of openings. From a cross-sectional view, the well structure, at the openings, has a negative slope. From a plan view, each opening corresponds to an organic electronic component. Each opening within the array of openings has a width and two immediately adjacent openings within the array of openings are connected by a channel having a width less than the width of each opening. The process further includes the step of depositing an organic active layer within the openings.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

DETAILED DESCRIPTION

Figure 1:
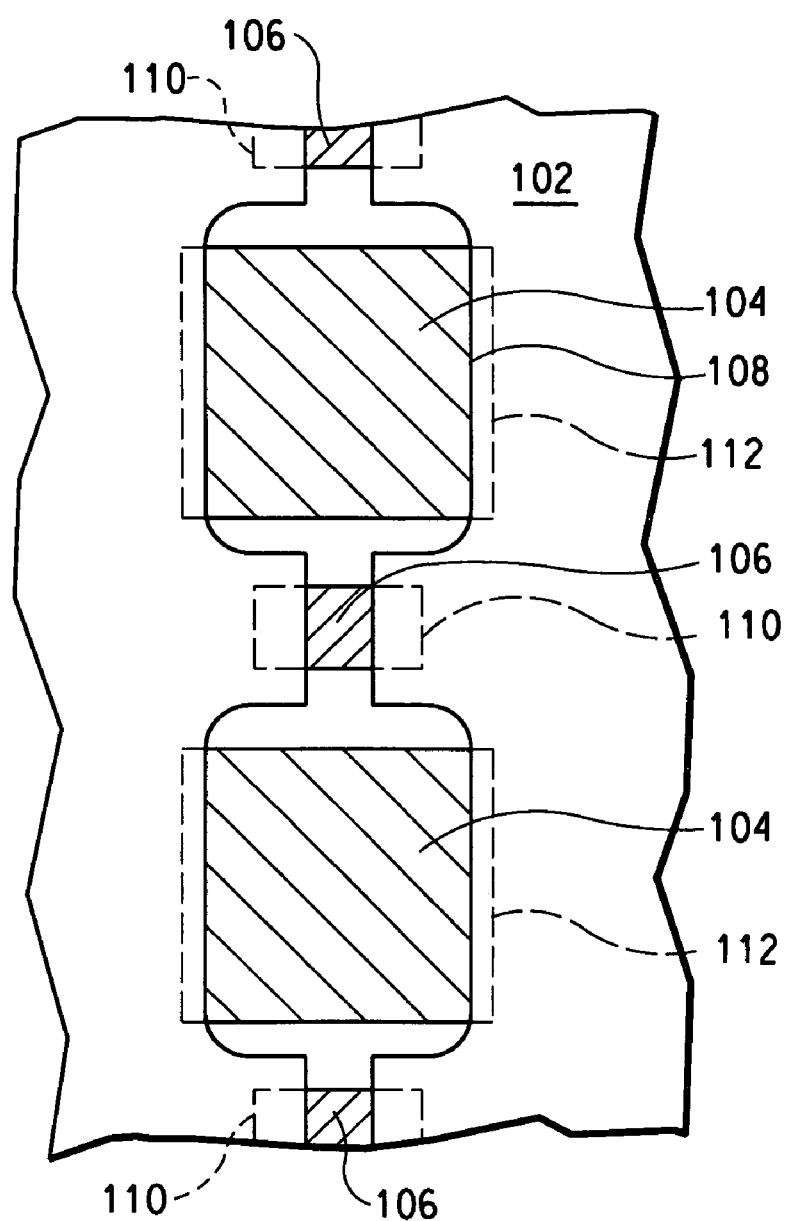
FIG. 1 includes an illustration of a plan view of an exemplary well structure.

An electronic device includes a substrate and a well structure overlying the substrate and defining an array of openings. From a cross-sectional view, the well structure, at the openings has a negative slope. From a plan view, each opening corresponds to an organic electronic component. Each opening within the array of openings has a width and two immediately adjacent openings within the array of openings are connected by a channel having a width less than the width of each opening.

The electronic device may further include an electrode lying within the two immediately adjacent openings and within the channel, wherein the electrode provides a conduction path between the two immediately adjacent openings along the electrode. The electrode may form a conduction path between organic electronic components along a vector of the array of openings.

In one embodiment, each opening within the array has a length. For example, the length is substantially perpendicular to the width and the width is not greater than the length.

In another embodiment, a channel structure overlies the substrate wherein, from a plan view, the channel structure is located between the two immediately adjacent openings and within the channel. From a cross-sectional view, the channel structure may have positive slope. Alternatively, from a cross-sectional view, the channel structure has a negative slope. In a further embodiment, from a cross-sectional view, the height of the channel structure is less than the height of the well structure. The surface of the channel structure may be hydrophobic. The surface of the well structure may be hydrophobic.

In a further embodiment, the organic electronic component comprises an organic active layer lying substantially within the opening. The electronic device may further include an electrode lying between the substrate and the organic active layer. The surface of the electrode may be hydrophilic. The electrode does not underlie the channel.

In one embodiment, an electronic device includes a substrate and a first structure overlying the substrate and defining an array of openings. From a cross-sectional view, the first structure, at the openings, has a negative slope. From a plan view, each opening corresponds to an organic electronic component. Two immediately adjacent openings are connected by a channel. The electronic device further includes a second structure overlying the substrate and located between the two immediately adjacent openings and within the channel.

In one example, from a cross-sectional view, the second structure has a positive slope. Alternatively, from a cross-sectional view, the second structure has a negative slope. From a cross-sectional view, the height of the second structure may be less than the height of the first structure.

In another example, the electronic device includes an electrode lying within the two immediately adjacent openings and overlying the second structure. The electrode provides a conduction path between the two immediately adjacent openings along the electrode.

In a further example, the surface of the first structure is hydrophobic. The surface of the second structure may be hydrophobic.

In another example, the organic component comprises an organic active layer lying substantially within each opening. The electronic device may further include an electrode lying between the substrate and the organic active layer. The substrate may include a driver circuit coupled to the organic electronic component.

In a further example, a portion of the first structure overlies a portion of the second structure. Each opening may have a width, wherein the width of the channel is less than the width of each opening.

A process for forming an electronic device includes the step of forming a well structure over a substrate. The well structure defines an array of openings. From a cross-sectional view, the well structure, at the openings, has a negative slope. From a plan view, each opening corresponds to an organic electronic component. Each opening within the array of openings has a width and two immediately adjacent openings within the array of openings are connected by a channel having a width less than the width of each opening. The process further includes the step of depositing an organic active layer within the openings.

In another example, the process includes forming an electrode lying within the two immediately adjacent openings and lying within the channel, wherein portions of the electrode lying within the two immediately adjacent openings and lying within the channels are connected to each other. The electrode forms a conduction path between the two immediately adjacent openings along the electrode.

In a further example, the process includes forming an electrode before forming the well structure, wherein after forming the well structure, a portion of the electrode is exposed along the bottom of at least one opening of the array of openings. In one embodiment, the electrode does not extend into the channels.

In another example, the process includes forming a channel structure, wherein from a plan view, the channel structure is located between the two immediately adjacent openings and within the channel. Forming the channel structure may be performed prior to forming the well structure. From a cross-sectional view, the channel structure may have a positive slope. Alternatively, from a cross-sectional view the channel structure may have a negative slope. In one embodiment, the height of the channel structure is less than the height of the well structure. The process may further include treating a surface of the channel structure to make the surface hydrophobic. The process may also include treating a surface of the well structure to make the surface hydrophobic.

Other features and advantages of the invention will be apparent from the following detailed description, and from the claims. The detailed description first addresses Definitions followed by Structures, Layers and Components of an Electronic Device, Process for Forming Electronic Devices, Other Embodiments, and Advantages.

1. Definitions and Clarification of Terms

Before addressing details of embodiments described below, some terms are defined or clarified.

The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "channel" is intended to mean a passage between openings.

The term "channel structure" is intended to mean a structure overlying a substrate, wherein the structure is at least partially located in a channel defined by another structure or structures.

The term "conduction path" is intended to mean a portion of a circuit through which a substantially constant current flows when (1) a direct current power is applied to such portion and (2) all switches, transistors, etc. in such portion are on. For example, a conduction path can include a wire by itself or a wire in combination with one or more diodes, resistors, transistors, or any combination thereof. For a transistor, current-carrying electrodes of the transistor are connected to the conductor path. A conduction path does not include a capacitor or an inductor because the current flowing through the conduction path significantly varies with time when a direct current signal is first applied to such capacitor or inductor.

The term "connected," with respect to openings is intended to mean that two or more openings are not entirely separated by the structure defining them. For example, two openings may be connected by a channel.

The term "driving circuit" is intended to mean a circuit configured to control a signal sent to an electronic component, another circuit, or a combination thereof.

The term "electrode" is intended to mean a member or structure configured to transport carriers within an electronic component. For example, an electrode may be an anode, a cathode, a capacitor electrode, a gate electrode, etc. An electrode may include a part of a transistor, a capacitor, a resistor, an inductor, a diode, an electronic component, a power supply, or any combination thereof.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the appropriate potential(s), performs a function. An electronic device may include or be part of a system. An example of an electronic device includes a display, a sensor array, a computer system, an avionics system, an automobile, a cellular phone, another consumer or industrial electronic product, or the like.

The terms "height," "length," and "width," when referring to a structure overlying a substrate, are intended to refer to dimensions substantially perpendicular to each other. "Height" is intended to refer to a distance above an underlying substrate. "Length" is intended to refer to a dimension within a plane substantially parallel to the substrate. "Width" is intended to refer to a dimension within a plane substantially parallel to the substrate and substantially perpendicular to the "length" dimension. In one embodiment, the "width" is not greater than the "length." In another embodiment, the "width" is a diameter of a circle.

The term "hydrophilic" is intended to mean that an edge of a liquid exhibits a wetting angle less than 90 degrees with respect to a surface that it contacts.

The term "hydrophobic" is intended to mean that an edge of a liquid exhibits a wetting angle of 90 degrees or more with respect to a surface that it contacts.

The term "immediately adjacent," is intended to mean that a layer, member or structure is immediately next to another layer, member or structure. Immediately adjacent is intended to expressly cover any direction, including diagonal.

The term "liquid medium" is intended to mean a liquid material, including a pure liquid, a combination of liquids, a solution, a dispersion, a suspension, and an emulsion. Liquid medium is used regardless whether one or more solvents are present.

The term "matrix" is intended to mean organization of electronic components extending in two directions. A matrix can include at least two rows and at least two columns.

The term "negative slope" is intended to mean a characteristic of a structure, wherein a side of the structure forms an acute angle with respect to a substantially planar surface over which the structure is formed.

The term "opening" is intended to mean an area characterized by the absence of a particular structure that delimits the area, as viewed from the perspective of a plan view.

The term "organic active layer" is intended to mean one or more organic layers, wherein at least one of the organic layers, by itself, or when in contact with a dissimilar material is capable of forming a rectifying junction.

The term "organic electronic component" is intended to mean an electronic component that includes one or more layers including organic material.

The term "overlying" does not necessarily mean that a layer, member, or structure is immediately next to or in contact with another layer, member, or structure.

The term "perimeter" is intended to mean a boundary that, from a plan view, surrounds at least a portion of a corresponding component or structure.

The term "positive slope" is intended to mean a characteristic of a structure, wherein a side of the structure forms an obtuse angle with respect to a substantially planar surface over which the structure is formed.

The term "structure" is intended to mean one or more patterned layers or members, which by itself or in combination with other patterned layer(s) or member(s), forms a unit that serves an intended purpose. An example of a structure includes an electrode, a well structure, a channel structure, or the like.

The term "substantially parallel" is intended to mean that the orientations for a combination of one or more lines, one or more vectors, or one or more planes, are parallel or almost parallel such that any skewness is considered to be insignificant to one of ordinary skill in the art.

The term "substantially perpendicular" is intended to mean that orientations for a combination of one or more lines, one or more vectors, or one or more planes are perpendicular or almost perpendicular such that any angular difference from perpendicular is considered to be insignificant to one of ordinary skill in the art.

The term "substrate" is intended to mean a base material that can be either rigid or flexible and may include one or more layers of one or more materials, which can include, but are not limited to, glass, polymer, metal or ceramic materials or combinations thereof. The reference point for a substrate is the beginning point of a process sequence. The substrate may or may not include electronic components, circuits, or conductive members.

The term "surface treatment" is intended to mean an action performed to change a property of an exposed surface. In one embodiment, a surface treatment makes an exposed surface more hydrophobic or more hydrophilic. Each of fluorinating or adding a surfactant to an exposed surface is an example of a surface treatment.

The term "vector" is intended to mean an organization of electronic components or openings along a line or line segment. For example, a vector of electronic components or openings may lie along a row, a column, a diagonal, or the like.

The term "well structure" is intended to mean a structure overlying a substrate, wherein the structure serves a principal function of at least partially separating an object, a region, or any combination thereof within or overlying the substrate from another object or region.

The term "wetting angle" is intended to mean a tangent angle defined by (1) a solid surface and (2) an interface between a gas and a liquid at the solid surface as measured from the solid surface through the liquid to the gas-liquid interface.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the Periodic Table of the elements use the "New Notation" convention as seen in the *CRC Handbook of Chemistry and Physics,* 81$^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

2. Structures, Layers, and Components of an Electronic Device

In a particular embodiment, an electronic device includes an array of organic electronic components and a structure having openings and channels connecting openings. Each of the openings corresponds to a perimeter of each of the organic electronic components when viewed from a plan view. The structure has a negative slope at the openings when viewed from a cross-sectional view. Each organic electronic component may include first and second electrodes (e.g. an anode and a cathode) separated by one or more layers including an organic active layer. In one embodiment, the exemplary electronic device may also include a second structure that has a positive slope, such as a channel structure located at least partially within the channels.

In one exemplary embodiment, the array of organic electronic components may be part of a passive matrix. In another exemplary embodiment, the array of organic electronic components may be part of an active matrix. As such, exemplary embodiments of the electronic device may include active matrix and passive matrix displays.

Generally, each organic electronic component includes two electrodes separated by one or more organic active layers. In addition, one or more other layers, such as buffer, charge-blocking, charge-injecting, and charge-transport layers, may be included between the two electrodes. Structures having openings that correspond to the perimeter of each of the organic electronic components define wells within which, portions of the organic electronic components are formed. As such, these structures may periodically be described as well structures herein.

The cross section of the well structures may influence organic layer formation. The structure may have a negatively sloped wall or perimeter and form an acute angle with an underlying structure. A portion of a perimeter of an exemplary structure forms an acute angle between the surface of an underlying structure and the structure wall. In one exemplary embodiment, the angle is between 0° and 90°, such as between 0° and 60° or between 10° and 45°. In an alternative embodiment, the angle may be about equal to or greater than the capillary angle.

FIG. 1 includes a plan view illustration of a point in a sequence for forming exemplary structures. A well structure 102 overlies a substrate and has openings 104 and channels 106 between the openings 104. From a cross-sectional view, the well structure 102 has a negative slope at the openings 104. The openings 104 are connected by the channel 106. Optionally, a channel structure 110 lies within the channel 106.

An electrode 112 underlying the well structure 102 is at least partially exposed by the openings 104. The openings 104 correspond to an organic electronic component. The electronic component may include the underlying electrode 112, an organic layer lying at least partially within the perimeter 108 (not illustrated), and an overlying electrode (not illustrated).

In one example, the well structure 102 may have a thickness between approximately 2 and 10 micrometers. The channel structure 110 may have a thickness not greater than 10 micrometers. For example, the channel structure 110 may have a thickness of less than 3 micrometers, such as between approximately 1 and 3 micrometers or less than 1 micrometer such as approximately 0.4 micrometers. The well structure 102 may, for example, have a thickness at least 1.5 times greater than that of the channel structure 110. Alternatively, the thickness of the channel structure 110 is equal to or greater than the thickness of the well structure 102.

In another embodiment, an electronic device includes a substrate, a structure (e.g., a well structure), and a first electrode. The structure has openings and channels and, when viewed from a cross-sectional view, has a negative slope at the openings. From a plan view, each of the openings corresponds to an organic electronic component. The first electrode lies within the openings and channels and overlies structures within the channels. Portions of the first electrode lying within the openings and the channels are connected to each other. In a particular example, the organic electronic component may include one or more organic active layers. In one embodiment, the first electrode may be a common electrode (e.g., common cathode or common anode for an array of organic electronic components).

In another exemplary embodiment, a second electrode may lie between the substrate and the structure. In a further exemplary embodiment, the organic electronic component may be coupled to a driver circuit (not illustrated) lying within the substrate. Note that the second electrode may be formed before the first electrode in one embodiment.

In one exemplary embodiment, the structure or structures having the negative slope have surfaces that exhibit poor wetting, such as substantially hydrophobic surfaces. The surfaces exhibit wetting angles with liquid compositions greater than 45°, such as 90° or higher. In contrast, underlying structures, such as electrodes may have substantially hydrophilic surfaces, exhibiting wetting angles of liquid compositions less than 90°, such as less than 60° or between approximately 0° and about 45°.

3. Process for Forming Electronic Devices

An exemplary process for forming electronic devices includes forming one or more structures that overlie a substrate and have a negative slope from a cross-sectional perspective. One exemplary process is illustrated in FIGS. 2 through 11, which can be used to form an active matrix display. Variations on this process may be used to form other electronic devices.

Figure 2:
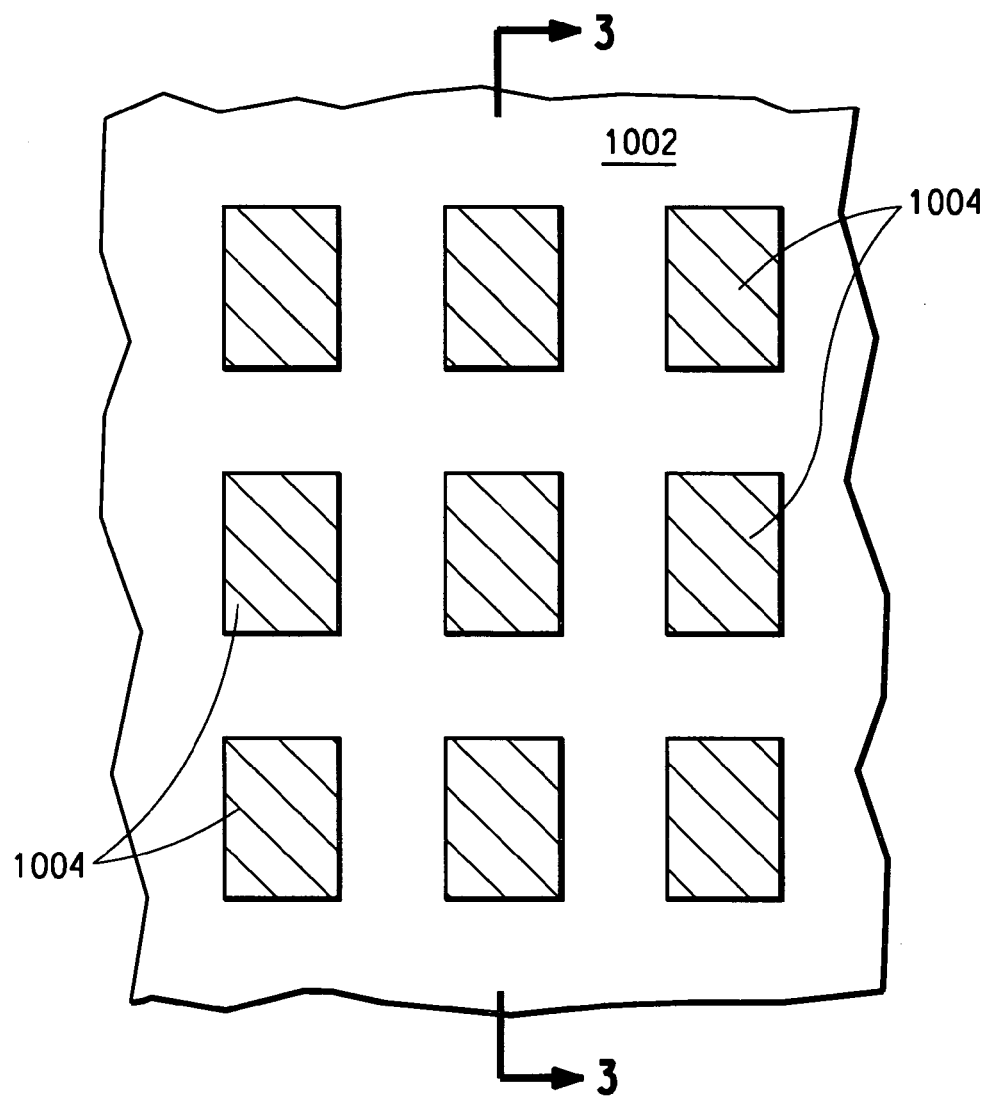
FIGS. 2 and 3 include illustrations of a plan view and a cross-sectional view, respectively, of a portion of a substrate after forming electrodes over the substrate.
Figure 3:
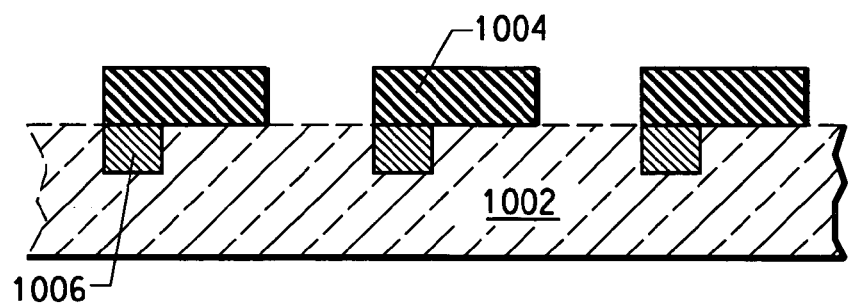

FIG. 2 includes a plan view illustration of a point in an exemplary process sequence, and FIG. 3 illustrates a cross-sectional view as viewed from sectioning line 3—3 in FIG. 2. First electrodes 1004 are deposited on a substrate 1002. The substrate 1002 may be a glass or ceramic material or a flexible substrate comprising at least one polymer film. In one exemplary embodiment, the substrate 1002 is transparent. Optionally, the substrate 1002 may include a barrier layer, such as a uniform barrier layer or a patterned barrier layer.

The first electrodes 1004 may be anodes or cathodes. FIG. 2 depicts the first electrodes 1004 as a patterned array of structures having plan view shapes, such as rectangles. Alternatively, the first electrodes 1004 may be a patterned array of structures having a plan view shape including a square, a rectangle, a circle, a triangle, an oval, or any combination thereof. In another embodiment, the first electrodes 1004 may be parallel strips. Generally, the first electrodes 1004 may be formed using conventional processes (e.g., deposition, patterning, or a combination thereof).

The first electrodes 1004 may include conductive material. In one embodiment, the conductive material may include a transparent conductive material, such as indium-tin-oxide (ITO). Other transparent conductive materials include, for example, indium-zinc-oxide. Another exemplary conductive material includes, zinc-tin-oxide (ZTO), an elemental metal, a metal alloy, or a combination thereof. The first electrodes 1004 may also be coupled to conductive leads (not illustrated). In one exemplary embodiment, the first electrodes 1004 may have hydrophilic surfaces. Optionally, driving circuits 1006 may be formed in the substrate.

Figure 4:
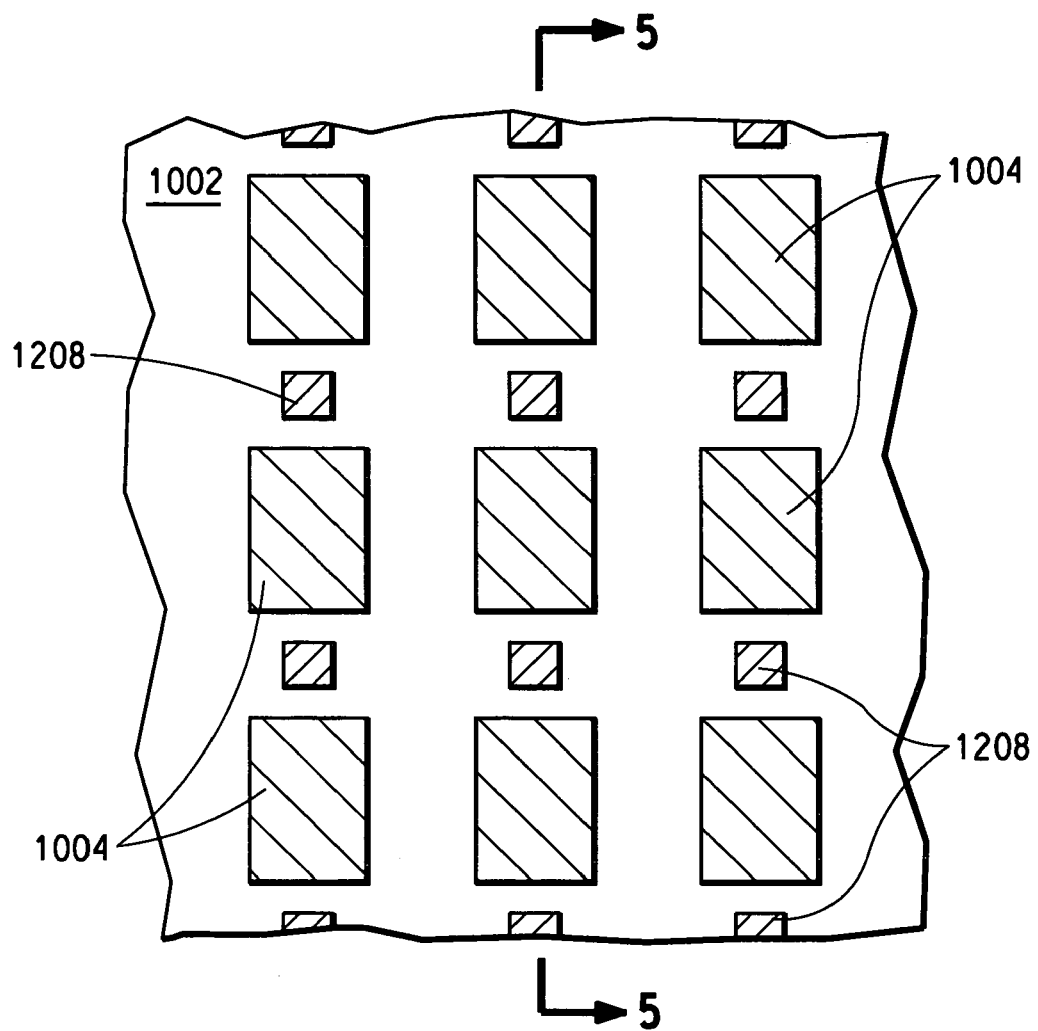
FIGS. 4 and 5 include illustrations of a plan view and a cross-sectional view, respectively, of the portion of the substrate of FIGS. 2 and 3 after forming a channel structure over the substrate.
Figure 5:
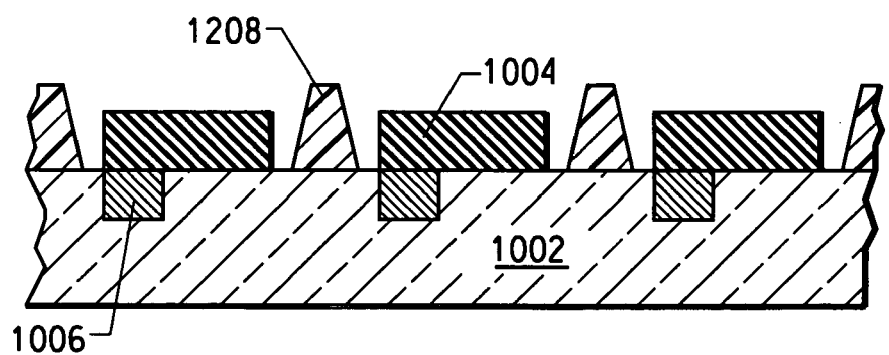

A subsequent layer may be deposited and patterned to form channel structures as illustrated in FIG. 4. FIG. 5 illustrates a cross-sectional view as viewed from sectioning line 5—5 in FIG. 4. Channel structures 1208 are located between the first electrodes 1004. In one embodiment, the channel structures 1208 do not contact the first electrodes 1004 and are spaced from the first electrodes 1004 to prevent thinning of the thickness of a subsequently formed organic active layer in proximity to the first electrodes 1004. The channel structures 1208 may, for example, be spaced from the first electrodes by at least approximately 1 micron, such as at least approximately 5 microns. In particular embodiments, thinning of the thickness of the organic active layer is undesirable and may result in electrical shorts and current leakage. In one exemplary embodiment, the channel structures 1208 have a positive slope. Alternatively, the channel structures 1208 have a vertical or negative slope.

In one exemplary embodiment, the channel structures 1208 may be formed from one or more resist or polymeric layers. The resist layer can, for example, be a negative resist material or positive resist material. The resist layer can be deposited on the substrate 1002 and over the first electrodes 1004. Liquid deposition techniques include spin coating, gravure coating, curtain coating, dip coating, slot-die coating, spray coating, continuous nozzle coating, continuous dispense techniques, ink jet printing, gravure printing, screen printing or any combination thereof. The resist may be patterned through selective exposure to radiation, such as ultraviolet (UV) radiation. In one embodiment, the resist layer is spin deposited and baked (not illustrated). The resist layer is exposed to UV radiation through a mask (not illustrated), developed, and baked, leaving channel structures 1208 having a positive slope. The channel structures 1208 may further be hard baked, further UV cured, or both. In other embodiments, other methods (e.g., screen printing, gravure printing, etc.) may be used to form the positive sloped channel structures 1208.

Alternatively, channel structures 1208 may be formed of inorganic materials, such as metals, oxides, and nitrides. Such inorganic materials may be deposited and patterned using conventional techniques.

Figure 6:
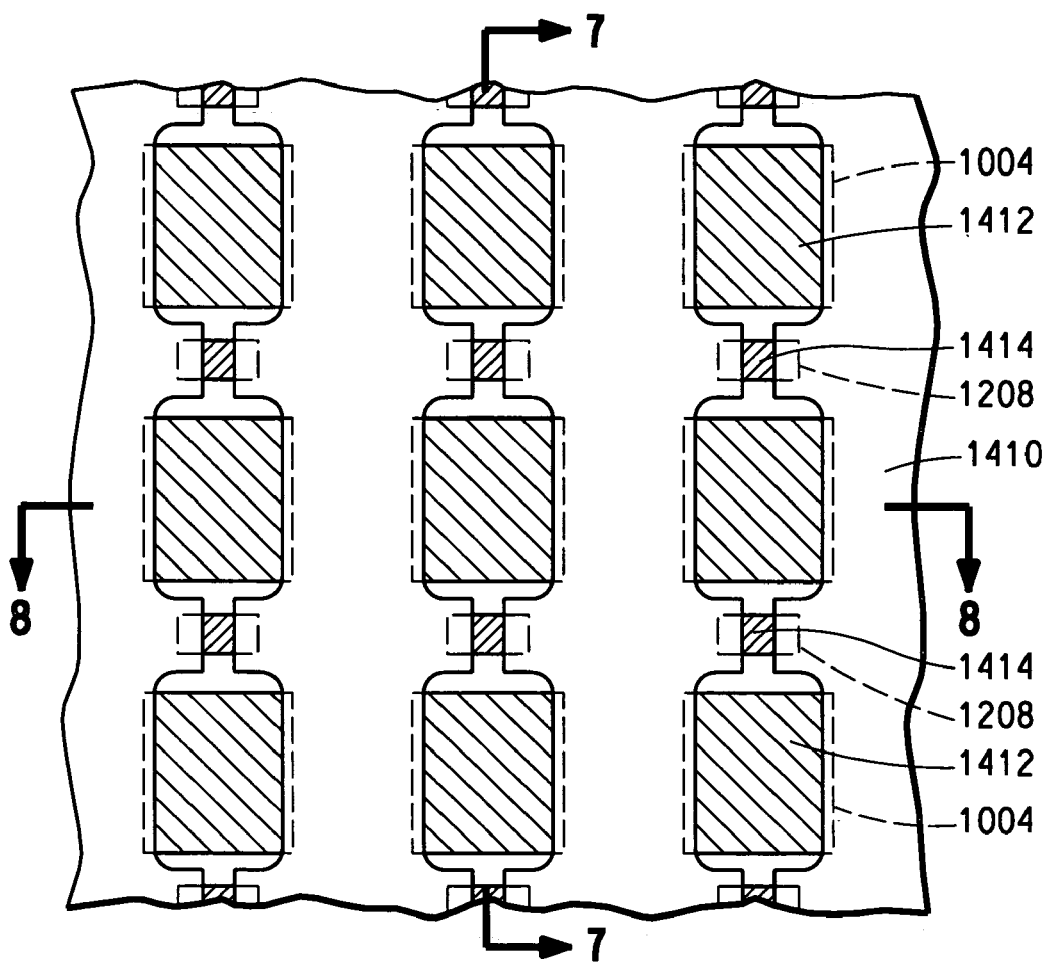
FIG. 6 includes a plan view illustration of the portion of the substrate of FIGS. 4 and 5 after formation of a well structure over the substrate.
Figure 7:
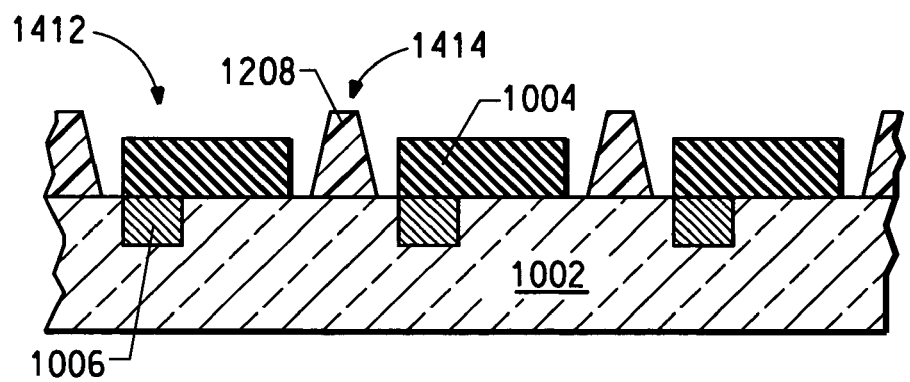
FIGS. 7 and 8 include cross-sectional view illustrations of the portion of the substrate of FIGS. 4 and 5 after formation of a well structure over the substrate.
Figure 8:
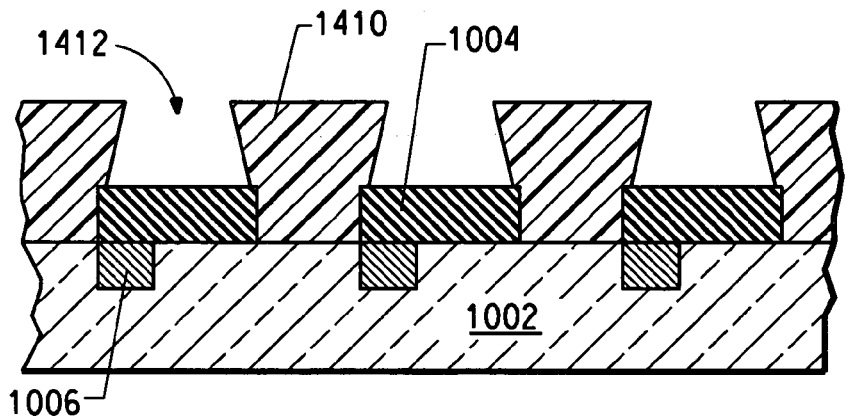

Another layer may be deposited and patterned into wells structures, as illustrated in FIG. 6. FIGS. 7 and 8 illustrate cross-sectional views as viewed from sectioning lines 7—7 and 8—8, respectively. A well structure 1410 includes openings 1412 and channels 1414. The openings 1412 and channels 1414 may expose portions of the first electrodes 1004 and portions of the channel structures 1208. As seen from the plan view, the bottom of the openings 1412 may include portions of the first electrodes 1004 or may also encompass a portion of the substrate 1002. At the openings 1412, the well structure 1410 has a negative slope, as illustrated in FIG. 8.

The well structure 1410 may have a pattern. The pattern may, for example, be the pattern illustrated in FIG. 6. Alternative patterns are illustrated in FIGS. 11, 12, 13, 14, 15 and 16, as described in the Other Embodiments section. As illustrated in FIG. 6, the pattern defines the openings 1412 and the channels 1414. The openings 1412 are generally arranged in an array, such as in columns and rows. The channels 1414 may connect adjacent openings 1412 in a column. Alternately, the channels 1414 may connect adjacent openings 1412 in columns, rows, diagonally, or any combination thereof.

Each of the openings 1412 has a width and length. The width of an opening 1412 is generally the latitudinal (i.e., shorter) dimension and the length is generally the longitudinal (i.e., longer) dimension. The length dimension is generally perpendicular to the width dimension. At their maximum, the length of the openings 1412 is equal to or greater than the width of the openings 1412. In embodiments in which the openings are circular, the length and width are equal. In one embodiment, the width of an opening 1412 is approximately 50 to 100 microns and the length of the opening 1412 is approximately 100 to 300 microns. The width of the channels 1414 can be less than the width of the openings 1412 at their maximum. In a particular embodiment, the width of channels 1414 is approximately 10 to 25 microns.

The well structure 1410 is formed such that the channel structures 1208 are located between openings 1412 and are at least partially located within the channels 1414. The first electrodes 1004 may be exposed along the bottoms of the openings 1412. In one embodiment, the first electrodes 1004 underlie both of the openings 1412 and portions of the channels 1414. In another embodiment, the first electrodes 1004 extend to and stop at the channels 1414. In a further embodiment, the first electrodes 1004 underlie a portion of the openings 1412 and the openings 1412 expose a portion of the substrate 1002.

In one exemplary embodiment, the height of the channel structures 1208 is less than the height of the well structure 1410. When the height of the channel structures 1208 is less than the height of the well structure 1410, the channel structures 1208 may be sloped positively, negatively, or vertical. Alternatively, the height of the channel structures 1208 is equal to or greater than the height of the well structure 1410. In particular embodiments, the height of the well structures, the height of the channel structures, or any combination thereof are approximately 2 to 10 micrometers.

In one exemplary embodiment, the well structure 1410 may be formed from resist or polymeric layers. The resist layer may, for example, be a negative resist material or positive resist material. The resist layer may be deposited on the substrate 1002 and over the first electrodes 1004. Liquid deposition techniques include spin coating, gravure coating, curtain coating, dip coating, slot-die coating, spray coating, continuous nozzle coating, continuous deposition coating, ink jet printing, gravure printing, screen printing, or any combination thereof. The resist layer may be patterned through selective exposure to radiation, such as ultraviolet (UV) radiation. In one embodiment, the resist layer is spin deposited and baked (not illustrated). The resist layer is exposed to UV radiation through a mask (not illustrated), developed, and baked, leaving a structure having a negative slope at the openings. The negative slope can be achieved by (1) using a UV flood exposure (not collimated) when using the masks or (2) overexposing the resist layer while the mask lies between the resist layer and a radiation source (not illustrated). Once formed, the well structure 1410 may be hard baked, further UV cured, or both.

In another exemplary embodiment (not illustrated), a sacrificial structure may be used. In one embodiment, a sacrificial layer is deposited and patterned to form a sacrificial structure having a positive slope. In a more specific embodiment, from a cross-sectional view, the sacrificial structure has a complementary profile as compared to the well structure 1410 that is subsequently formed. The thickness of the sacrificial layer is substantially the same as the subsequently formed well structure. In one embodiment, a sacrificial layer is deposited over the first electrodes 1004 and the substrate 1002. A patterned resist layer is formed over the sacrificial layer using a conventional technique. In one specific embodiment, a conventional resist-erosion etching technique is used to form sloped sidewalls. In another specific embodiment, a conventional isotropic etch is used. The patterned resist layer is then removed using a conventional resist removal process.

Another layer that will be used for the well structure 1410 is deposited over the sacrificial structure and within openings in the sacrificial structure. In one embodiment, that other layer has a thickness at least as thick as the thickness of the sacrificial structures. In other embodiments, that other layer is substantially thicker than the sacrificial layer. Portions of the other layer lying outside the sacrificial structure are removed using an etching or a polishing technique that is conventional within the inorganic semiconductor arts. After the portions have been removed, the well structure 1410 is formed. The sacrificial structure is then removed to form the openings 1412 and channels 1414 within the well structure 1410.

In one embodiment, the materials for the well and sacrificial structures are different to allow the material of one of the well and sacrificial structures to be removed selectively compared to the other structure. An exemplary material includes a metal, an oxide, a nitride, a resist material, or any combination thereof. The material for the sacrificial layer may be selected so that it can be selectively removed from the substrate 1002 without causing significant damage to the first electrodes 1004. After reading this specification, skilled artisans will be able to choose materials that meet their needs or desires.

Once the well structure 1410 and the channel structure 1208 are formed, the first electrodes 1004 exposed along the bottoms of the openings may be cleaned, such as through UV/ozone cleaning. The well structures 1410 and channel structures 1208 may be treated to produce surfaces that wet poorly with respect to liquid compositions used in the formation of organic layers, such as hydrophobic surfaces. For example, a fluorine-containing plasma may be used to treat the surfaces of the channel structures 1208 and well structures 1410. The fluorine plasma may be formed using gasses such as $CF_4$, $C_2F_6$, $NF_3$, $SF_6$, or any combination thereof. The plasma process may include direct exposure plasma or use a downstream plasma. In addition, the plasma may include $O_2$. In one exemplary embodiment, a fluorine-containing plasma may include 0–20% $O_2$, such as about 8% $O_2$.

In one particular embodiment, the plasma is produced using a March PX500 model plasma generator by March Plasma Systems of Concord, Calif. The equipment is configured in flow through mode with a perforated, grounded plate and a floating substrate plate. In this embodiment, a 15 cm (6-inch) floating substrate plate is treated with a plasma formed from a $CF_4/O_2$ gas composition. The gas composition may include 80–100% $CF_4$, such as approximately 92% $CF_4$, and 0–20% $O_2$, such as approximately 8% $O_2$ by volume. The substrate may be exposed for 2–5 minutes, such as approximately 3 minutes, at a pressure of 300–600 mTorr, such as a 400 mTorr, using a 200–500 W plasma, such as a 400 W plasma.

Figure 9:
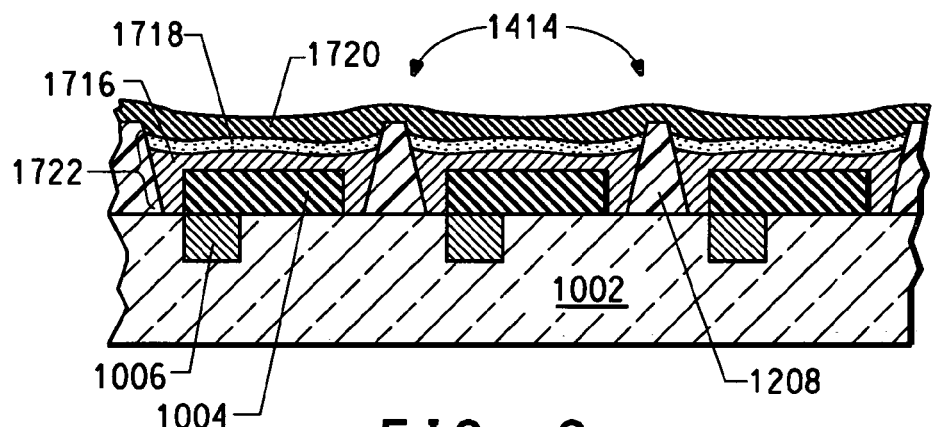
FIGS. 9 and 10 include cross-sectional view illustrations of the portion of the substrate of FIGS. 7 and 8, respectively, after forming an electrode over the well structure.
Figure 10:
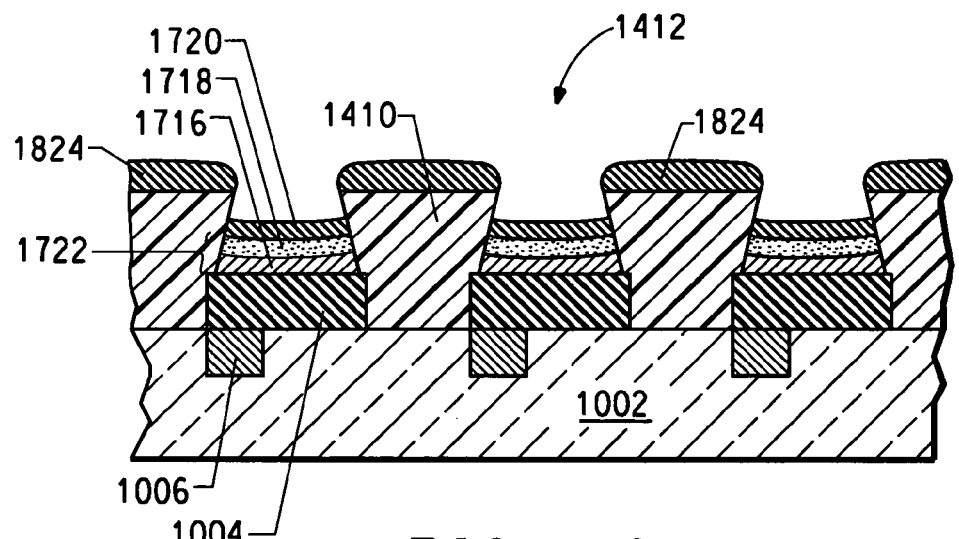

FIGS. 9 and 10 include illustrations of cross-sectional views after an organic layer 1722 and a second electrode 1720 are formed. For example, organic layer 1722 may include one or more organic layers. In one embodiment as illustrated in FIG. 9, the organic layer 1722 includes a charge transport layer 1716 and an organic active layer 1718. When present, the charge transport layer 1716 is formed over the first electrodes 1004 and before the organic active layer 1718 is formed. The charge transport layer 1716 can serve multiple purposes. In one embodiment, the charge transport layer 1716 is a hole-transport layer. Although not illustrated, an additional charge transport layer may be formed over the organic active layer 1718. Therefore, the organic layer 1722 may include the organic active layer 1718 and one, both or none of the charge transport layers. Each of the charge transport layer 1716, the organic active layer 1718, and additional charge transport layer may include one or more layers. In another embodiment, a single layer having a graded or continuously changing composition may be used instead of separate charge transport and organic active layers.

Returning to FIGS. 9 and 10, the charge transport layer 1716 and the organic active layer 1718 are formed sequentially over the first electrodes 1004. Each of the charge transport layer 1716 and the organic active layer 1718 can be formed by, for example spin coating, gravure coating, curtain coating, dip coating, slot-die coating, spray coating, continuous nozzle coating, continuous deposition coating, ink jet printing, gravure printing, screen printing, casting vapor depositing, or any combination thereof. For example, liquid compositions including the organic materials may be dispensed through one or more nozzles, such as micronozzles. One or both of the charge transport layer 1716 and the organic active layer 1718 may be cured after application.

In this embodiment, the charge transport layer 1716 is a hole-transport layer. The hole-transport layer can be used to potentially increase the lifetime and improve the reliability of the device compared to a device where the first electrodes 1004 would directly contact the organic active layer 1718. In one specific embodiment, the hole-transport layer can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer typically has a thickness in a range of approximately 100–250 nm.

The hole-transport layer typically is conductive to allow electrons to be removed from the subsequently formed active region and transferred to the first electrodes 1004. Although the first electrodes 1004 and the optional hole-transport layer are conductive, typically the conductivity of the first electrodes 1004 is significantly greater than the hole-transport layer.

The composition of the organic active layer 1718 typically depends upon the application of the organic electronic device. When the organic active layer 1718 is used in a radiation-emitting organic electronic device, the material(s) of the organic active layer 1718 will emit radiation when sufficient bias voltage is applied to the electrode layers. The radiation-emitting active layer may contain nearly any organic electroluminescent or other organic radiation-emitting materials.

Such materials can be small molecule materials or polymeric materials. Small molecule materials may include those described in, for example, U.S. Pat. No. 4,356,429 and U.S. Pat. No. 4,539,507. Alternatively, polymeric materials may include those described in U.S. Pat. No. 5,247,190, U.S. Pat. No. 5,408,109, and U.S. Pat. No. 5,317,169. Exemplary materials are semiconducting conjugated polymers. An example of such a polymer is poly(phenylenevinylene) ("PPV"). The light-emitting materials may be dispersed in a matrix of another material, with or without additives, but typically form a layer alone. The organic active layer generally has a thickness in the range of approximately 40–100 nm.

When the organic active layer 1718 is incorporated into a radiation receiving organic electronic device, the material(s) of the organic active layer 1718 may include many conjugated polymers and electroluminescent materials. Such materials include, for example, many conjugated polymers and electro- and photo-luminescent materials. A specific example includes poly(2-methoxy,5-(2-ethyl-hexyloxy)-1,4-phenylenevinylene) ("MEH-PPV") or MEH-PPV composite with CN-PPV. The organic active layer 1718 typically has a thickness in a range of approximately 50–500 nm.

Although not illustrated, an optional electron-transport layer may be formed over the organic active layer 1718. The electron-transport layer is another example of a charge transport layer. The electron-transport layer typically is conductive to allow electrons to be injected from a subsequently formed cathode and transferred to the organic active layer 1718. Although the subsequently formed cathode and the optional electron-transport layer are conductive, typically the conductivity of the cathode is significantly greater than the electron-transport layer.

In one specific embodiment, the electron-transport layer can include metal-chelated oxinoid compounds (e.g., $Alq_3$); phenanthroline-based compounds (e.g., 2,9-dimethyl-4,7-diphenyl-1,10-phenanthroline ("DDPA"), 4,7-diphenyl-1, 10-phenanthroline ("DPA")); azole compounds (e.g., 2-(4-biphenyl)-5-(4-t-butylphenyl)-1,3,4-oxadiazole ("PBD"), 3-(4-biphenyl)-4-phenyl-5-(4-t-butylphenyl)-1,2,4-triazole ("TAZ"); or any one or more combinations thereof. Alternatively, the optional electron-transport layer may be inorganic and comprise BaO, LiF, or $Li_2O$. The electron-transport layer typically has a thickness in a range of approximately 30–500 nm.

Any one or more of the charge transport layer 1716, organic active layer 1718, and additional charge transport layer may be applied as a liquid composition that includes one or more liquid media. The hydrophobic and hydrophilic surfaces are specific with respect to the liquid media within the liquid composition. In one embodiment, the liquid composition may include a co-solvent including, for example, an alcohol, a glycol, a glycol ether, or any combination thereof. A solvent for the organic active layer liquid media may be select such that it does not dissolve the charge transport layer 1716. Alternatively, the solvent may be selected such that the charge transport layer 1716 is soluble or partially soluble in that solvent.

In a particular embodiment, the negative slope of the well structure 1410 causes a capillary effect, drawing a liquid composition of the organic layer 1722 around the perimeter of the openings 1412. Once cured, the organic layer 1722 covers one or more underlying layers within the openings 1412, such as the first electrodes 1004.

A second electrode 1720 is formed over the organic layer 1722, which in this embodiment includes the charge transport layer 1716 and the organic active layer 1718. In one embodiment, a layer is vapor deposited to form conductive members 1824 on the well structures 1410 and to form the second electrodes 1720 over the organic active layer 1718 and over portions of the channel structures 1208. The difference in elevation between the second electrode 1720 and the conductive members 1824 keeps them from being connected. As illustrated in FIG. 9, the second electrode 1720 overlies layers within the openings 1412 and portions of the channel structures 1208. The portions of the second electrode 1720 overlying the organic layers 1722 within the openings 1412 and the portions of the second electrode 1720 overlying portions of the channel structure 1208 are connected to each other to form an electrically continuous structure. Alternatively, a layer may be deposited using a stencil mask to form the second electrodes 1720. A conventional evaporation technique, or sputtering technique is used to form the second electrodes 1720.

In one embodiment, the second electrodes 1720 act as cathodes. A layer of the second electrodes 1720 closest to the organic layer 1718 can be selected from a Group 1 metal (e.g., Li, Cs), a Group 2 (alkaline earth) metal, a rare earth metal including any one or more of the lanthanides, the actinides, or any combination thereof. The second electrode 1720 and the conductive members 1824 have a thickness in a range of approximately 300–600 nm. In one specific, non-limiting embodiment, a Ba layer of less than approximately 10 nm followed by an Al layer of approximately 500 nm may be deposited. The Al layer may be replaced by or used in conjunction with any one of more of the metals and metal alloys, as previously described with respect to the first electrodes 1004.

As depicted in FIGS. 9 and 10, the organic electronic components, including the first electrodes 1004, the organic layers 1722, and the second electrodes 1720, are addressable via the driving circuit 1006. For example, applying a potential across each of the second electrodes 1720 and one selected driving circuit 1006 activates one organic electronic component.

An encapsulating layer (not illustrated) can be formed over the array and the peripheral and remote circuitry to form a substantially complete electrical device, such as an electronic display, a radiation detector, or a photovoltaic cell. The encapsulating layer may be attached at the rail such that no organic layers lie between it and the substrate. Radiation may be transmitted through the encapsulating layer. If so, the encapsulating layer should be transparent to the radiation.

4. Other Embodiments

Figure 11:
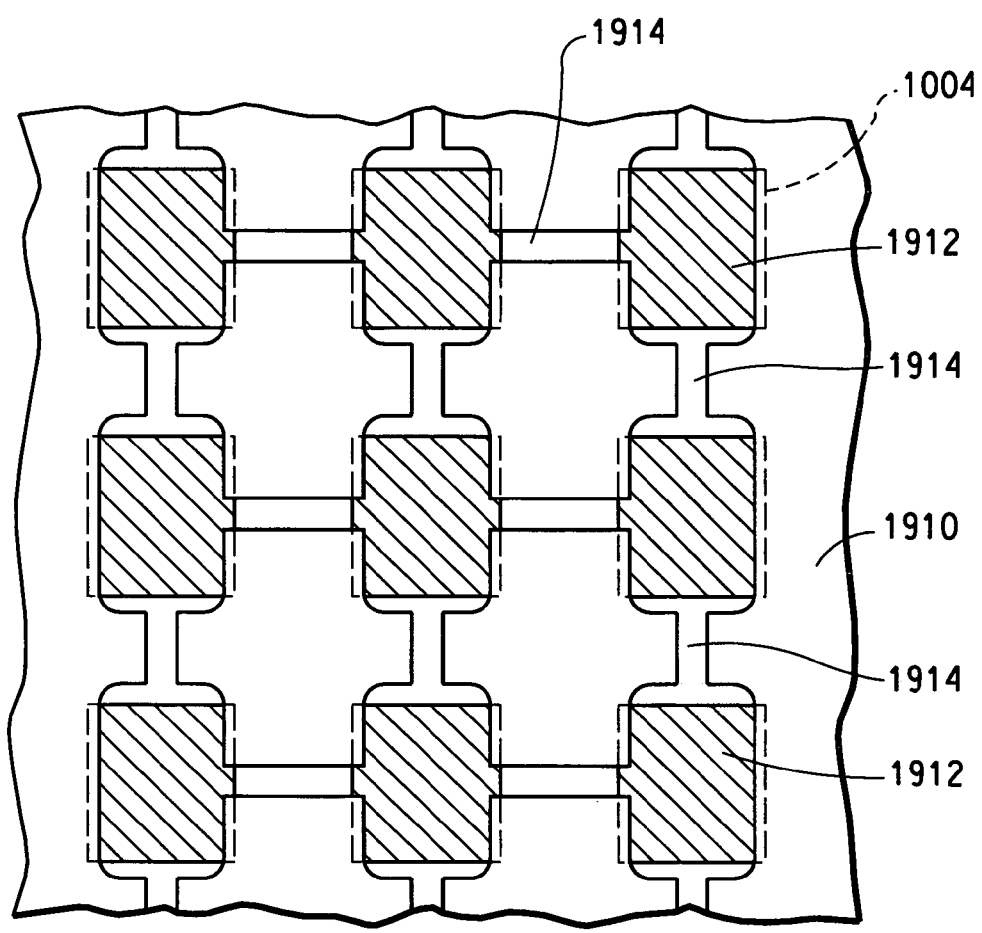
FIGS. 11, 12, 13, 14, 15 and 16 include plan view illustrations of exemplary well structures overlying a portion of a substrate.

The electronic device may alternatively be formed without the formation of channel structures, as illustrated in FIG. 11. The well structure 1910 defines openings 1912 and channels 1914. The width of the channels 1914 may be adjusted to limit liquid composition wicking and to limit liquid composition flow. Generally, narrower channels are more likely to result in wicking and wider channels aid in liquid composition flow. Channels of medium width limit both liquid wicking and liquid composition flow. In further exemplary embodiments, the well structure 1910 may be formed from more than one layer or structure.

Figure 12:
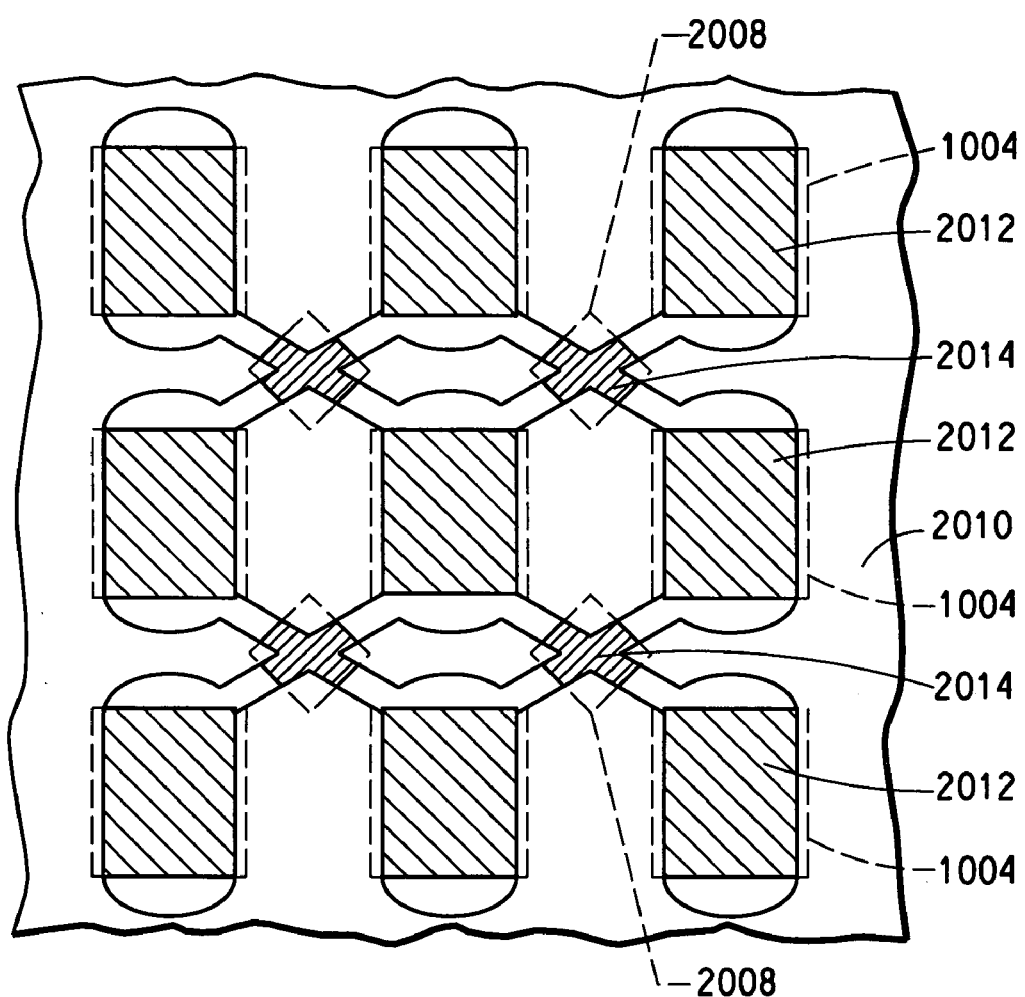
Figure 13:
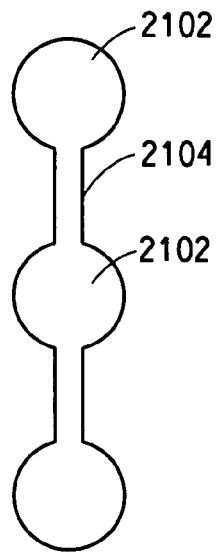
Figure 14:
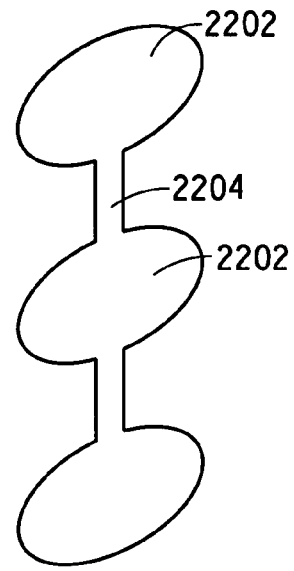
Figure 15:
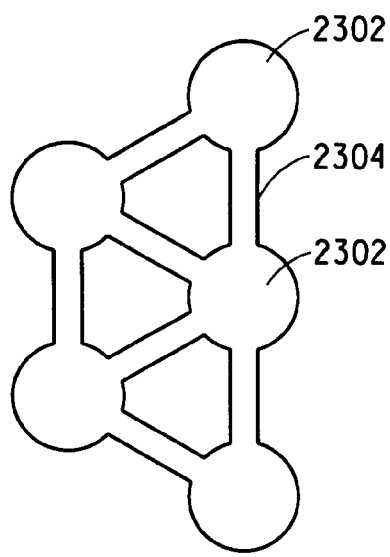

In another exemplary embodiment illustrated in FIG. 12, the openings 2012, as defined by well structure 2010, may be connected using diagonal channels 2014. Channel structures 2008 may at least partially lie within the diagonal channels 2014. Alternatively, the openings and channels may form any one or more patterns, such as the patterns included in the plan view illustrations of FIGS. 13, 14, and 15. For example, the openings 2102 may be circular and the channels 2104 may connect the openings 2102 along a column as illustrated in FIG. 13. In another example illustrated in FIG. 14, the openings 2202, which may be oval-shaped, capsule-shaped or pill-shaped openings, have their major axes skewed at an angle relative to a column and connected in the direction of the column by channels 2204. In a further example illustrated in FIG. 15, the openings 2302 may be connected in a triangular lattice that includes channels 2304.

Figure 16:
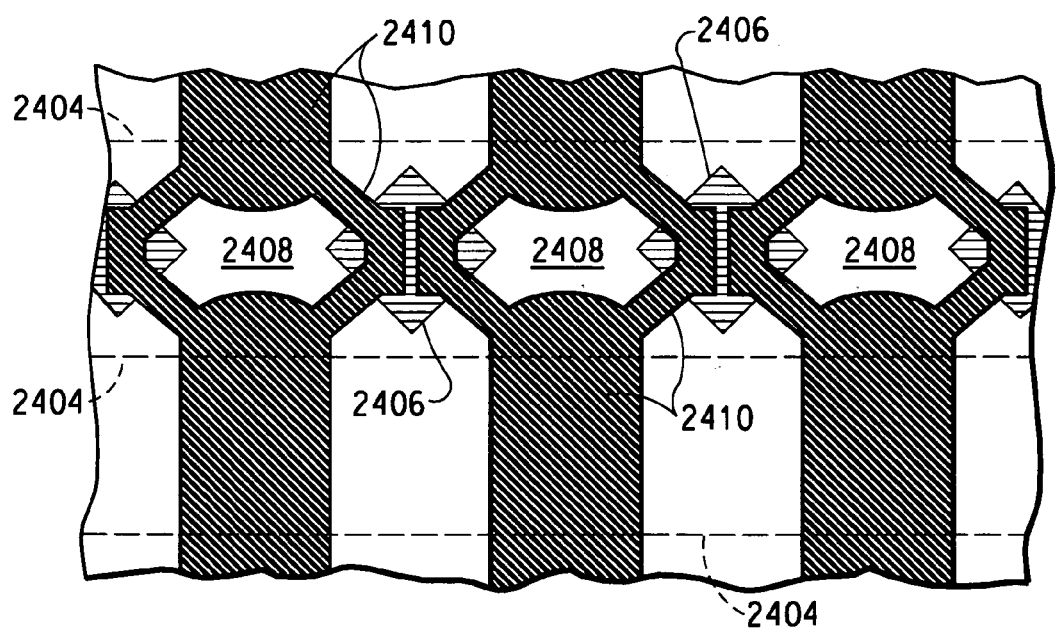

The electronic device formed through the process illustrated in FIGS. 2–10 is an active matrix device. In an alternate embodiment, the electronic device may be a passive matrix device. FIG. 16 illustrates an exemplary passive matrix device. For example, parallel strips of first electrodes 2404 may overlie a substrate. In FIG. 16, the first electrodes 2404 have lengths extending in a horizontal direction and underlie the openings at their widest points. Channel structures 2406 and well structure 2408 may be formed in a pattern that facilitates formation of second electrodes 2410, which are generally formed perpendicular to the first electrodes 2404. Alternatively the parallel strips of the first electrodes 2404 may lie under the well structure illustrated in FIG. 16 and the channels and the second electrodes 2410 may horizontally connect the openings.

In a further embodiment, the process for forming the electronic device may be used in fabricating radiation responsive devices, such as sensor arrays, photodetectors, photoconductive cells, photoresistors, photoswitches, phototransistors, phototubes, IR detectors, biosensors, photovoltaics or solar cells. Radiation responsive devices may include a transparent substrate and transparent substrate side electrode. Alternatively, the radiation responsive device may include a transparent overlying electrode.

In still a further embodiment, the process for forming the electronic device may be used for inorganic devices. In one embodiment, a liquid composition for forming an inorganic layer may be used and allow better coverage of the liquid composition adjacent to the same or other structures having a negative slope.

5. Advantages

In one particular embodiment, the patterned well structure including openings and channels and, optionally, the channel structures facilitate formation of electrodes that provide a conduction path between adjacent organic electronic components. These structures are compatible with normal incident angle deposition techniques useful in forming electrodes, such as cathodes. Typically, these deposition techniques are less expensive and, in some examples, quicker, leading to less expensive electronic devices and improved production rates.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges includes each and every value within that range.

What is claimed is:

1. An electronic device comprising:
   a substrate; and
   a well structure overlying the substrate and defining an array of openings, wherein:
      from a cross-sectional view, the well structure, at the openings, has a negative slope;
      from a plan view, each opening corresponds to an organic electronic component, each opening within the array of openings has a width; and
      two immediately adjacent openings within the array of openings are connected by a channel having a width less than the width of each opening.

2. The electronic device of claim 1, further comprising an electrode lying within the two immediately adjacent openings and within the channel, wherein the electrode provides a conduction path between the two immediately adjacent openings along the electrode.

3. The electronic device of claim 2, wherein the electrode forms a conduction path between organic electronic components along a vector of the array of openings.

4. The electronic device of claim 1, wherein each opening within the array has a length, wherein the length is substantially perpendicular to the width and the width is not greater than the length.

5. The electronic device of claim 1, further comprising a channel structure overlying the substrate, wherein, from a plan view, the channel structure is located between the two immediately adjacent openings and within the channel.

6. The electronic device of claim 5, wherein from a cross-sectional view, the channel structure has a positive slope.

7. The electronic device of claim 5, wherein from a cross-sectional view, the height of the channel structure is less than the height of the well structure.

8. The electronic device of claim 5, wherein a portion of the well structure overlies a portion of the channel structure.

9. The electronic device of claim 5, wherein a surface of the channel structure is hydrophobic.

10. An electronic device comprising:
a substrate;
a first structure overlying the substrate and defining an array of openings, wherein:
from a cross-sectional view, the first structure, at the openings, has a negative slope;
from a plan view, each opening corresponds to an organic electronic component; and
two immediately adjacent openings are connected by a channel having a width less than a width of each opening; and
a second structure overlying the substrate and located between the two immediately adjacent openings and within the channel, wherein from a cross-sectional view, the second structure has a positive slope.

11. The electronic device of claim 10, wherein from a cross-sectional view, the height of the second structure is less than the height of the first structure.

12. The electronic device of claim 10, further comprising an electrode lying within the two immediately adjacent openings and overlying the second structure, the electrode providing a conduction path between the two immediately adjacent openings along the electrode.

13. The electronic device of claim 10, wherein a surface of the second structure is hydrophobic.

14. The electronic device of claim 10, wherein the organic component comprises an organic active layer lying substantially within each opening.

15. A process for forming an electronic device comprising the steps of:
forming a well structure over a substrate, the well structure defining an array of openings, wherein:
from a cross-sectional view, the well structure, at the openings, has a negative slope;
from a plan view, each opening corresponds to an organic electronic component;
each opening within the array of openings has a width; and
two immediately adjacent openings within the array of openings are connected by a channel having a width less than the width of each opening; and
depositing an organic active layer within the openings.

16. The process of claim 15, further comprising forming an electrode lying within the two immediately adjacent openings and lying within the channel, wherein portions of the electrode lying within the two immediately adjacent openings and lying within the channels are connected to each other, the electrode forming a conduction path between the two immediately adjacent openings along the electrode.

17. The process of claim 15, further comprising forming a channel structure, wherein from a plan view, the channel structure is located between the two immediately adjacent openings and within the channel.

18. The process of claim 17, further comprising treating a surface of the channel structure to make the surface hydrophobic.

* * * * *